US 7,564,055 B2

(12) United States Patent
Hoffman

(10) Patent No.: US 7,564,055 B2
(45) Date of Patent: Jul. 21, 2009

(54) TRANSISTOR INCLUDING A DEPOSITED CHANNEL REGION HAVING A DOPED PORTION

(75) Inventor: Randy Hoffman, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 51 days.

(21) Appl. No.: 11/782,535

(22) Filed: Jul. 24, 2007

(65) Prior Publication Data

US 2007/0267699 A1  Nov. 22, 2007

Related U.S. Application Data

(62) Division of application No. 10/763,354, filed on Jan. 23, 2004, now Pat. No. 7,262,463.

(60) Provisional application No. 60/490,239, filed on Jul. 25, 2003.

(51) Int. Cl.
*H01L 21/00* (2006.01)
*H01L 31/0392* (2006.01)

(52) U.S. Cl. .............. 257/43; 257/59; 257/72; 257/347; 257/E29.053; 257/E29.117; 257/E29.273

(58) Field of Classification Search .......... 257/43, 257/59, 72, 347, E29.117, E29.273, 49, E29.053
See application file for complete search history.

(56) References Cited

U.S. PATENT DOCUMENTS 4,389,481 A   6/1983  Poleshuk
4,559,238 A  12/1985  Bujatti et al.
4,589,026 A   5/1986  Ozawa et al.
4,598,305 A * 7/1986  Chiang et al. ............... 257/66
4,622,656 A * 11/1986  Kamiya et al. ......... 365/185.15
4,887,255 A  12/1989  Handa et al.
4,984,043 A   1/1991  Vinal
5,107,314 A   4/1992  Kahng et al.
5,248,627 A   9/1993  Williams
5,525,822 A   6/1996  Vinal
5,607,868 A   3/1997  Chida et al.
5,656,844 A   8/1997  Klein
5,719,081 A   2/1998  Racanelli
5,744,864 A   4/1998  Cillessen et al.
5,936,291 A   8/1999  Makita et al.
6,027,978 A   2/2000  Gardner et al.

(Continued)

FOREIGN PATENT DOCUMENTS

EP          0040076          3/1986

(Continued)

OTHER PUBLICATIONS

Proceedings of the IEEE, Proceedings Letters, Nov. 1968, pp. 2094-2095.

(Continued)

*Primary Examiner*—Minh-Loan T Tran
*Assistant Examiner*—William Harriston

(57) ABSTRACT

A transistor having a gate electrode, a source electrode, a drain electrode, a dielectric material and a channel region disposed between the source electrode and drain electrode. The channel region includes a portion doped with an impurity to change the fixed charge density within the portion relative to a remainder of the channel region.

23 Claims, 2 Drawing Sheets

U.S. PATENT DOCUMENTS

| | | | |
|---|---|---|---|
| 6,078,082 | A | 6/2000 | Bulucea |
| 6,229,188 | B1 | 5/2001 | Aoki |
| 6,255,130 | B1 | 7/2001 | Kim |
| 6,255,655 | B1 | 7/2001 | McCroskey et al. |
| 6,362,499 | B1 | 3/2002 | Moise et al. |
| 6,391,462 | B1 | 5/2002 | Jang |
| 6,465,308 | B1 | 10/2002 | Cheng et al. |
| 6,489,632 | B1 | 12/2002 | Yamazaki et al. |
| 6,503,805 | B2 | 1/2003 | Wang et al. |
| 6,561,174 | B1 | 5/2003 | Afshari |
| 6,878,962 | B1 | 4/2005 | Kawasaki et al. |
| 7,067,843 | B2 * | 6/2006 | Carcia et al. ............... 257/59 |
| 7,274,048 | B2 * | 9/2007 | Wu ............................ 257/173 |
| 2001/0000494 | A1 | 4/2001 | Manning |
| 2002/0153587 | A1 | 10/2002 | Adkisson et al. |
| 2002/0171085 | A1 | 11/2002 | Suzawa et al. |
| 2003/0013261 | A1 | 1/2003 | Asano |
| 2003/0104659 | A1 | 6/2003 | Arakawa et al. |
| 2003/0139026 | A1 | 7/2003 | Lucovsky |
| 2003/0180996 | A1 | 9/2003 | Yamazaki et al. |
| 2003/0186489 | A1 | 10/2003 | Ishikawa |
| 2003/0207502 | A1 | 11/2003 | Yamazaki et al. |
| 2003/0218221 | A1 | 11/2003 | Wager, III et al. |
| 2003/0218222 | A1 * | 11/2003 | Wager et al. ............... 257/410 |
| 2003/0219530 | A1 | 11/2003 | Yamazaki et al. |
| 2003/0224550 | A1 | 12/2003 | Kokubo et al. |
| 2004/0023432 | A1 | 2/2004 | Haga |
| 2005/0173734 | A1 * | 8/2005 | Yoshioka et al. ............ 257/202 |
| 2006/0060857 | A1 * | 3/2006 | Mardilovich et al. .......... 257/66 |
| 2006/0086976 | A1 * | 4/2006 | Mardilovich et al. ........ 257/347 |
| 2006/0088962 | A1 * | 4/2006 | Herman et al. .............. 438/151 |
| 2006/0228887 | A1 * | 10/2006 | Thirukkovalur et al. ..... 438/674 |
| 2006/0284172 | A1 * | 12/2006 | Ishii ............................. 257/43 |
| 2006/0286737 | A1 * | 12/2006 | Levy et al. ................... 438/199 |
| 2007/0023750 | A1 * | 2/2007 | Chiang et al. ................. 257/43 |
| 2007/0034915 | A1 * | 2/2007 | Hoffman .................... 257/291 |
| 2007/0108446 | A1 * | 5/2007 | Akimoto ...................... 257/61 |

FOREIGN PATENT DOCUMENTS

| | | |
|---|---|---|
| EP | 0529950 | 3/1993 |
| JP | 01 307268 | 12/1989 |
| JP | 2003/086808 | 3/2003 |

OTHER PUBLICATIONS

Extended abstracts of the 2000 International Conference on Solid State Devices and Materials; Aug. 29-31, 2000, Sendai Intl Center, pp. 128-129.

Ohtomo, "Novel Semiconductor Technologies of ZnO Films towards . . .", IEICE Trans. Electron., vol. E83-C, No. 10, Oct. 2000, pp. 1614-1617.

* cited by examiner

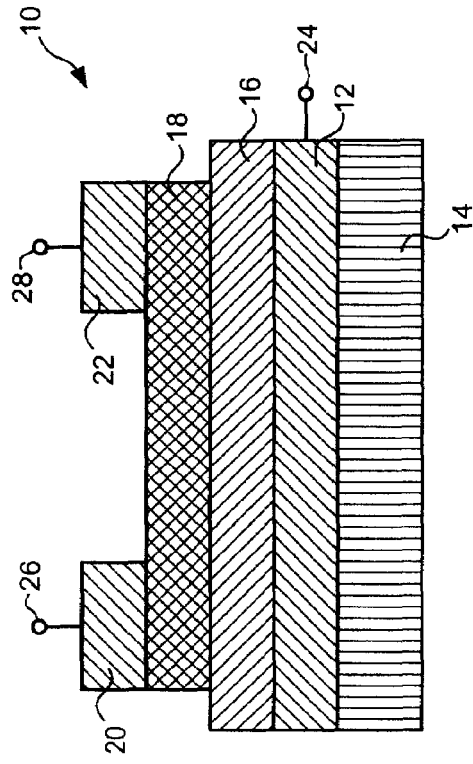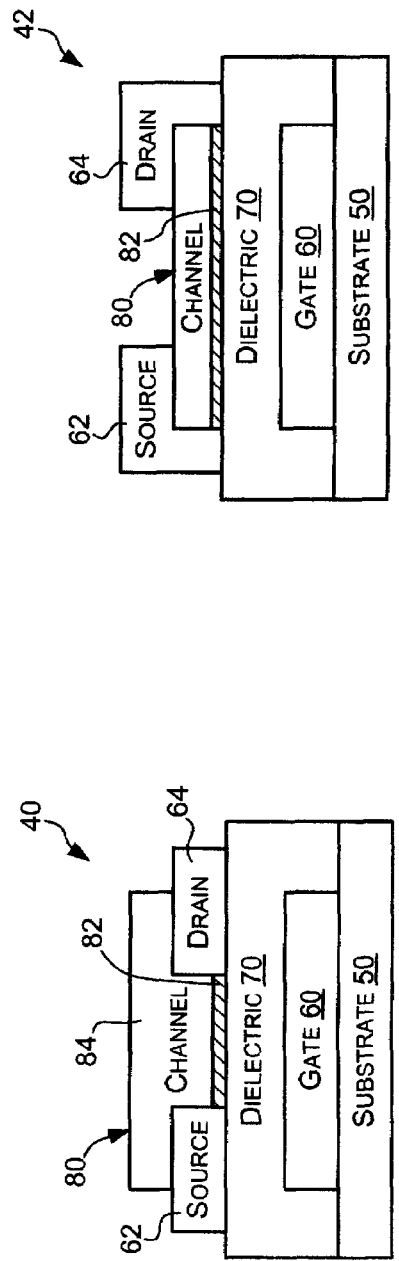

TRANSISTOR INCLUDING A DEPOSITED CHANNEL REGION HAVING A DOPED PORTION

CROSS-REFERENCE TO RELATED APPLICATION

This application is a divisional of commonly assigned application Ser. No. 10/763,354, filed Jan. 23, 2004 now U.S. Pat. No. 7,262,463, which claimed priority from copending application Ser. No. 60/490,239 filed on Jul. 25, 2003, which all are hereby incorporated by reference herein.

BACKGROUND

Thin-film transistors and other three-port semiconductor devices typically include gate, source and drain electrodes. A semiconductive thin-film channel is disposed between the source electrode and drain electrode. The transistor also includes a dielectric insulator physically separating the gate electrode from the channel, and from the source electrode and the drain electrode. The semiconductive channel provides an electrical pathway between the source and drain electrodes having controllable conductive properties. In particular, the voltage applied to the gate electrode causes the conductive properties of the channel to vary. Specifically, the applied gate voltage controls the ability of the channel material to permit charge transport through the channel material between the other two electrodes (e.g., a source electrode and drain electrode). The electrical properties of the various materials used in the thin-film transistor determine the threshold voltage required to turn on the transistor and induce a conductive pathway between the source and drain electrodes.

BRIEF DESCRIPTION OF THE DRAWINGS

FIG. 1 depicts an embodiment of an exemplary three-port semiconductor device according to the present description, in the form of a thin-film transistor.

FIG. 2 schematically depicts an exemplary embodiment of a thin-film transistor according to the present description in which a portion of the transistor's channel is doped to vary the threshold gate voltage required to turn on the transistor.

FIGS. 3-5 schematically depict further exemplary embodiments of thin-film transistors according to the present description.

DETAILED DESCRIPTION

Figure 6:
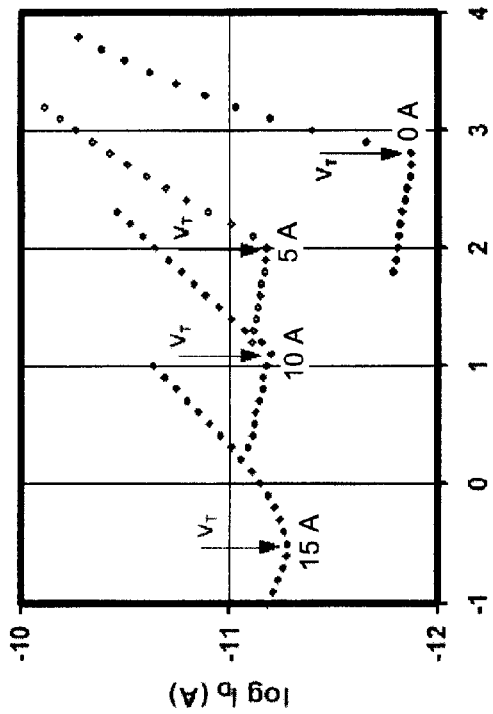
FIG. 6 depicts various current-voltage characteristic curves showing variation in threshold voltage that may be achieved by dimensionally varying doped regions within embodiments of the thin-film transistor channels of the present description.

The present description pertains to a system and method involving a multi-port semiconductor device in which a novel configuration is employed in one or more of the charge-carrying portions of the device. The present system and method is applicable to a variety of semiconductor applications, but has proved particularly useful in the context of thin-film transistor (TFT) technologies.

FIG. 1 depicts an exemplary three-port semiconductor device according to the present description, such as thin-film transistor (TFT) 10. As shown, TFT 10 may employ a bottom-gate structure, in which material comprising a gate electrode 12 is disposed adjacent a substrate 14. A dielectric 16 is disposed atop gate 12. A channel layer 18 is interposed between dielectric 16 and source electrode 20 and drain electrode 22. As known in the transistor arts, electrical conditions existing at gate electrode 12 (e.g., a gate voltage applied to port 24) determine the ability of the device to transport charge through channel 18 between source 20 and drain 22 (e.g., as current flowing through the channel between ports 26 and 28).

It will be appreciated that a variety of different fabrication techniques and materials may be employed to fabricate a thin-film transistor, such as that shown in the figure. In the depicted example, substrate 14 may be formed from glass and coated with a material such as indium-tin oxide (ITO) to form the gate electrode. Although the gate electrode and dielectric are depicted as blanket-coated, unpatterned layers in FIG. 1, they may in general be patterned as appropriate. A channel layer is disposed over the dielectric, as will be explained, and indium-tin oxide contacts are disposed for the source and drain electrodes. Regardless of the particular fabrication techniques, the different regions are disposed/configured so that: the source and drain electrodes are physically separate from one another (e.g., separated by the channel material); the three ports (source, drain and gate) are physically separated from each other (e.g., by the dielectric and channel); and the dielectric separates the gate from the channel.

The ITO source/drain contacts may be deposited via RF sputtering, or through other suitable deposition methods. The source and drain contacts may be disposed via patterning with shadow masks or the like, or through other suitable patterning methods.

FIGS. 2-5 depict further embodiments of a thin-film transistor according to the present description. The different exemplary embodiments are respectively depicted as 40, 42, 44 and 46.

Typically, as in the depicted examples, the thin-film transistor will be constructed on a substrate 50, such as glass or another suitable material. Various layers of conductive material, insulative/dielectric material and semiconductive material are deposited and/or patterned to provide conductive electrodes and interposed material having desired electrical characteristics.

For many of the particular fabrication methods or sequences used to create the various portions of the device, typical configurations will include: (a) three primary electrodes, referred to as the gate 60, source 62 and drain 64; (b) a dielectric material 70 interposed between gate electrode 60 and each of the source and drain electrodes 62 and 64, such that dielectric material 70 physically separates the gate from the source and drain; (c) a semiconductive material, referred to as the channel 80, disposed so as to provide a controllable electric pathway between the source electrode and the drain electrode. This general configuration is depicted in each of the examples of FIGS. 2-5. In such a configuration, as discussed with reference to the examples discussed above, voltage applied at gate electrode 60 varies the ability of channel 80 to permit electrical charge to move between the source and drain electrodes. The conductive properties of the channel are thus controlled at least in part through application of a voltage at the gate electrode.

The source, drain and gate electrodes may be fabricated from gold, aluminum or another suitable conductive metal or other material. In many cases, it will be desirable to deposit excess conductive material (e.g., as a blanket layer) and then pattern the electrode as desired using masks, etching and the like. Various different materials may be employed as dielectric 70, though silicon dioxide has proved useful in many settings.

The thin-film examples described herein do not include a channel fabricated from the bulk semiconductor material. Instead, channel 80 typically is deposited as a thin layer immediately adjacent dielectric material 70. Indeed, it will be appreciated that the depictions in the figures are exemplary and are intended to be schematic. The relative dimensions of a device constructed according to the present description, or of its constituent parts, may vary considerably from the relative dimensions shown in the present figures.

For many of the sequences in which channel 80 and source/drain electrodes 62 and 64 are deposited and patterned, the resulting configuration typically is as described above, namely that the channel is positioned so as to provide a controllable charge pathway between the source and drain electrodes, and dielectric 70 physically separates the channel and gate electrode 60. Any suitable semiconductor material may be employed for channel 80. For example, zinc oxide, tin oxide or indium oxide may be used in fabricating the channel. As described in detail below, it may in some cases be desirable to dope this underlying channel material so that an impurity is introduced into a portion of channel 80. Typically, this portion will be a boundary region at or near the interface between the channel and dielectric.

As in the depicted examples, a thin-film transistor according to the present description may take a variety of different configurations. FIGS. 2 and 3 show exemplary thin-film transistors having bottom gate configuration. A substrate 50 is employed, though configurations omitting a substrate are possible. Gate electrode 60 is then deposited and patterned as appropriate. Dielectric 70 is deposited on top of the gate electrode and is patterned as necessary. The channel 80 and source and drain electrodes 62 and 64 are then deposited and patterned as appropriate. In the example of FIG. 2, the source and drain electrodes are formed first, and then channel 80 is deposited on top of the source and drain electrodes. In the example of FIG. 3, channel 80 is deposited first, and the source/drain electrodes are subsequently deposited.

Figure 4:
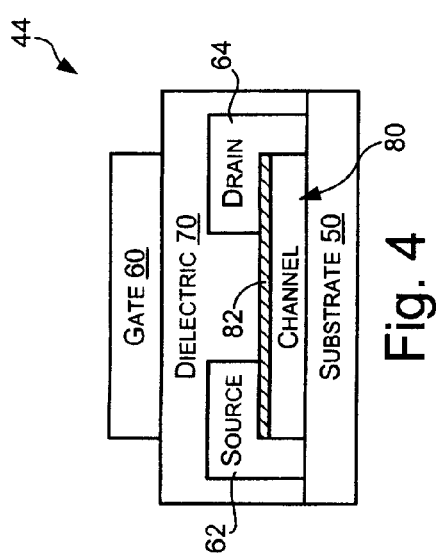
Figure 5:
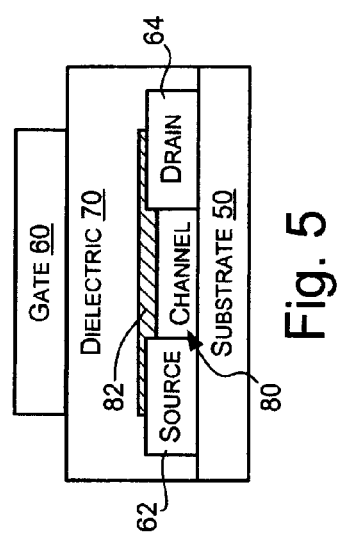

A top gate structure may be employed, as in the examples of FIGS. 4 and 5. In such a configuration, a substrate 50 may again be employed, but the source 62, drain 64 and channel 80 are formed prior to depositing of the layers comprising dielectric 70 and gate electrode 60. In the example of FIG. 4, channel 80 is deposited first as a thin film, and source 62 and drain 64 are deposited and patterned on top of the deposited channel layer. In the example of FIG. 5, channel 80 is deposited on top of the already-formed source and drain electrodes 62 and 64. In either case, dielectric 70 is deposited next and patterned as necessary, and gate electrode 60 is deposited and patterned on top of dielectric 70.

It will be appreciated that in the examples discussed herein, the conductive properties of channel 80 (FIGS. 2-5) will vary depending upon the voltage applied at gate electrode 60. At a certain gate voltage level, referred to as the turn-on or threshold voltage, the ability of the channel to transport charge in response to an applied potential is activated. At gate voltages below the threshold, the source-drain current in response to a give source-drain potential typically does not change as the gate voltage is increased (or at least the drain current does not significantly increase; see the related discussion of FIG. 7 below). Once the threshold voltage is achieved, however, increases in gate voltage produce a steadily increasing source-drain current.

In certain applications, it will be desirable that the transistor threshold voltage by consistently and reproducibly controlled over some desired range of voltage. Furthermore, it will at times be desirable that the transistor be configured with a threshold voltage of zero volts.

Accordingly, the underlying material of channel 80 may be doped with an impurity in a boundary region 82 at or near the interface between channel 80 and dielectric 70. The impurity typically is selected so as to increase or decrease the fixed charge introduced within the channel in the doped area. This variation in turn provides variation in the turn-on voltage required to induce a conductive pathway between the source and drain electrodes.

As discussed above, typically only a portion of the channel is doped differently to provide the turn-on voltage variation. Usually the doped area is a boundary portion 82 or region at or near the interface between channel 80 and dielectric 70. One way in which this is achieved is by depositing a distinct layer of differently-doped channel material so that the distinct layer is adjacent to and in contact with dielectric 70 as in the depicted examples of FIGS. 2-5. The remaining layer or layers of the channel (e.g., portion 84 in FIG. 2) are fabricated with the same underlying material (e.g., zinc oxide) but are not doped with the additional impurity. Additionally or alternatively, a region of differently-doped material may be achieved by varying certain processing parameters during deposition of the channel layers, so as to achieve a localized region of the channel that is doped differently than the rest of the channel.

The impurity introduced into the boundary region may be a donor-type impurity that interacts with the underlying material so as to increase the positive fixed charged density introduced into the doped region. The higher positive charge density thus lowers the gate voltage required to induce a conductive path between source electrode 62 and drain electrode 64. In the case where zinc oxide is employed as the underlying channel material, aluminum is an example of a suitable donor-type impurity that may be introduced in order to increase the fixed positive charge density within the boundary region 82, and thereby lower the turn-on voltage required at gate electrode 60 to induce conduction between source 62 and drain 64. Other donor-type impurities that may be employed for with underlying zinc-oxide channel include boron, gallium, indium, fluorine and chlorine. The impurities may be incorporated into the device via RF sputtering, DC or ion beam sputtering (e.g., from an oxide target or reactively from a metal target), thermal or e-beam evaporation, chemical vapor deposition, pulsed laser deposition, atomic layer deposition, molecular beam epitaxy and/or other suitable methods.

Acceptor-type impurities may also be employed, so as to increase the fixed negative charge density within the differently-doped region and thereby effect an increase in threshold voltage. As with the donor-type impurities, such variation in doping typically will be implemented only within a portion of the channel, with such portion typically being at or near the interface between channel 80 and dielectric 70. Exemplary acceptor-type impurities that may be used with a zinc-oxide channel include nitrogen, phosphorus, arsenic, antimony, lithium, sodium, potassium and copper.

For an underlying indium oxide channel, acceptable donor-type impurities include silicon, germanium, tin, lead, fluorine and chlorine, while acceptable acceptor-type impurities include nitrogen, phosphorous, arsenic and antimony. For an underlying tin oxide channel, acceptable donor-type impurities include arsenic, antimony, bismuth, fluorine and chlorine, while acceptable acceptor-type impurities include boron, aluminum, gallium, indium, nitrogen, phosphorus, arsenic and antimony.

It has been determined that the obtained variation in threshold voltage varies with the dimensions of the differently-doped portion of channel 80. FIG. 6 depicts various I-V characteristics for doped regions within the channel boundary region having varying thicknesses. The depicted data was obtained using thin-film transistors according to the present description having a width-to-length ratio of 6:1 and using a furnace anneal temperature of 400 degrees Celsius. The underlying channel material employed was zinc oxide, and the different transistors were formed to have a differently-doped interfacial layer within the channel. Aluminum was employed as a donor-type dopant impurity to create the boundary layer adjacent the transistor dielectric material.

Threshold voltage was evaluated by setting the drain-to-source voltage at a fixed value (10 V in the present example) and sweeping the gate voltage. The figure shows transfer curves for four different transistors, where boundary region channel thickness (e.g., of the differently-doped boundary region 82) is 0, 5, 10 and 15 Å, respectively, moving from right to left in the figure. The threshold voltage for each transfer characteristic is indicated with a vertical arrow, at the swept voltage where the drain current begins to increase as a function of increasing gate voltage. As shown in the figure, threshold voltage $V_T$ decreases by roughly 1 V for each 5 Å in thickness of the differently-doped channel region.

It should be appreciated that the thin-film transistor technologies of the present disclosure may be employed in a variety of different applications. One application includes deployment of a channel with the described selective doping in an active matrix display using thin-film transistors, such as display 100 in FIG. 7. In display applications and other applications, it will often be desirable to fabricate the channel and other device layers to be at least partially transparent.

Figure 7:
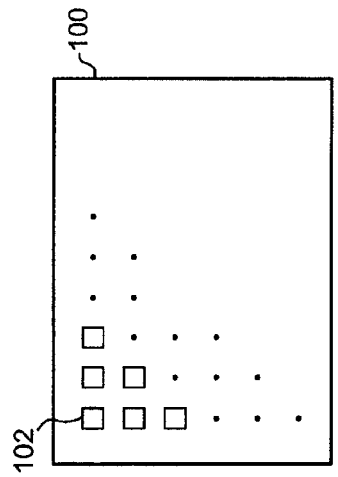
FIG. 7 depicts an embodiment of an exemplary display system in which the thin-film transistor technologies of the present description may be employed.

Referring still to FIG. 7, Exemplary display 100 includes a plurality of display elements, such as pixels 102, which collectively operate to display image data. Each pixel may include one or more thin-film transistors, such as that described above, in order to selectively control activation of the pixels. For example, each pixel may include three thin-film transistors, one for each of a red, blue and green sub-pixel. In such a display, the transistor examples described herein may be employed as a switch to selectively control activation of the sub-pixel.

While the present embodiments and method implementations have been particularly shown and described, those skilled in the art will understand that many variations may be made therein without departing from the spirit and scope defined in the following claims. The description should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

What is claimed is:

1. A thin-film transistor, comprising:
   a source electrode;
   a drain electrode;
   a gate electrode;
   a deposited thin-film channel region having a portion doped with an impurity to change the fixed charge density within the portion relative to a remainder of the channel region that is not doped with the impurity and disposed between the source and drain electrode wherein the portion and the remainder are fabricated of the same underlying material; and
   a dielectric material electrically separating the gate electrode from the channel region and in contact with the portion doped with the impurity; wherein the deposited thin-film channel is capable of changing a charge density in the portion doped with the impurity.

2. The thin-film transistor of claim 1, where the portion of the channel region is disposed between the remainder of the channel region and the dielectric material.

3. The thin-film transistor of claim 1, where the dielectric material includes silicon dioxide.

4. The thin-film transistor of claim 1, where the channel region comprises a controllable electrical pathway between the source electrode and drain electrode.

5. A thin-film transistor, comprising:
   a source electrode;
   a drain electrode;
   a gate electrode;
   a deposited thin-film channel region having a portion doped with an impurity to change the fixed charge density within the portion relative to a remainder of the channel region that is not doped with the impurity and disposed between the source and drain electrode wherein the portion and the remainder are fabricated of the same underlying material and wherein the channel region is a deposited layer fabricated from a binary oxide semiconductor material; and
   a dielectric material electrically separating the gate electrode from the channel region and in contact with the portion doped with the impurity; wherein the deposited thin-film channel is capable of changing a charge density in the portion doped with the impurity.

6. The thin-film transistor of claim 5, where the channel region is fabricated from zinc oxide.

7. A thin-film transistor, comprising:
   a source electrode;
   a drain electrode;
   a gate electrode;
   a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
   a dielectric material electrically separating the gate electrode from the channel region, wherein the impurity is a donor-type impurity which increases the positive fixed charge density within the portion of the channel region.

8. A thin-film transistor, comprising:
   a source electrode;
   a drain electrode;
   a gate electrode;
   a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
   a dielectric material electrically separating the gate electrode from the channel region wherein the impurity is an acceptor-type impurity which increases the negative fixed charge density within the portion of the channel region.

9. A thin-film transistor, comprising:
a source electrode;
a drain electrode;
a gate electrode;
a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
a dielectric material electrically separating the gate electrode from the channel region, where the channel region is fabricated from zinc oxide and wherein the impurity is a donor-type impurity which increases the positive fixed charge density within the portion of the channel region.

10. The thin-film transistor of claim 9, where the donor-type impurity is selected from the group consisting of aluminum, boron, gallium, indium, fluorine and chlorine.

11. The thin-film transistor of claim 9, where the donor-type impurity is aluminum.

12. A thin-film transistor, comprising:
a source electrode;
a drain electrode;
a gate electrode;
a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
a dielectric material electrically separating the gate electrode from the channel region, where the channel region is fabricated from zinc oxide and wherein the impurity is an acceptor-type impurity which increases the negative fixed charge density within the portion of the channel region.

13. The thin-film transistor of claim 12, where the acceptor-type impurity is selected from the group consisting of nitrogen, copper, phosphorous, arsenic, antimony, lithium, sodium and potassium.

14. A thin-film transistor, comprising:
a source electrode;
a drain electrode;
a gate electrode;
a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
a dielectric material electrically separating the gate electrode from the channel region, wherein the channel region is fabricated from indium oxide.

15. The thin-film transistor of claim 14, where the impurity is a donor-type impurity which increases the positive fixed charge density within the portion of the channel region.

16. The thin-film transistor of claim 15, where the donor-type impurity is selected from the group consisting of silicon, germanium, tin, lead, fluorine and chlorine.

17. The thin-film transistor of claim 14, where the impurity is an acceptor-type impurity which increases the negative fixed charge density within the portion of the channel region.

18. The thin-film transistor of claim 17, where the acceptor-type impurity is selected from the group consisting of nitrogen, phosphorous, arsenic and antimony.

19. A thin-film transistor, comprising:
a source electrode;
a drain electrode;
a gate electrode;
a deposited thin-film channel region having a portion doped with an impurity to change the fixed charge density within the portion relative to a remainder of the channel region and disposed between the source and drain electrode wherein the channel region is a deposited layer fabricated from a binary oxide semiconductor material; and
a dielectric material electrically separating the gate electrode from the channel region, where the channel region is fabricated from zinc oxide and wherein the channel region is fabricated from tin oxide.

20. The thin-film transistor of claim 19, where the impurity is a donor-type impurity which increases the positive fixed charge density within the portion of the channel region.

21. The thin-film transistor of claim 20, where the donor-type impurity is selected from the group consisting of arsenic, antimony, bismuth, fluorine and chlorine.

22. The thin-film transistor of claim 19, where the impurity is an acceptor-type impurity which increases the negative fixed charge density within the portion of the channel region.

23. The thin-film transistor of claim 22, where the acceptor-type impurity is selected from the group consisting of boron, aluminum, gallium, indium, nitrogen, phosphorus, arsenic and antimony.

* * * * *